(12) United States Patent
Smal et al.

(10) Patent No.: US 11,558,983 B2
(45) Date of Patent: Jan. 17, 2023

(54) ELECTRONIC EQUIPMENT FOR A VEHICLE

(71) Applicant: VALEO SYSTEMES DE CONTROLE MOTEUR, Cergy Pontoise (FR)

(72) Inventors: Pierre Smal, Cergy Pontoise (FR); Emmanuel Talon, Cergy Pontoise (FR); Aymeric Fouque, Cergy Pontoise (FR)

(73) Assignee: VALEO SYSTEMES DE CONTROLE MOTEUR, Cergy Pontoise (FR)

( * ) Notice: Subject to any disclaimer, the term of this patent is extended or adjusted under 35 U.S.C. 154(b) by 0 days.

(21) Appl. No.: 17/276,967

(22) PCT Filed: Oct. 7, 2019

(86) PCT No.: PCT/EP2019/077046
§ 371 (c)(1),
(2) Date: Mar. 17, 2021

(87) PCT Pub. No.: WO2020/078748
PCT Pub. Date: Apr. 23, 2020

(65) Prior Publication Data
US 2022/0039297 A1 Feb. 3, 2022

(30) Foreign Application Priority Data
Oct. 17, 2018 (FR) .................................... 18 59604

(51) Int. Cl.
*H05K 7/20* (2006.01)
*B60L 58/26* (2019.01)
*H01M 10/625* (2014.01)

(52) U.S. Cl.
CPC ..... *H05K 7/20872* (2013.01); *H05K 7/20927* (2013.01); *B60L 58/26* (2019.02); *H01M 10/625* (2015.04); *H05K 7/20272* (2013.01)

(58) Field of Classification Search
CPC .......... H05K 7/20872; H05K 7/20927; B60L 58/26; H01M 10/625
See application file for complete search history.

(56) References Cited

U.S. PATENT DOCUMENTS

| | | | |
|---|---|---|---|
| 8,383,260 B2 * | 2/2013 | Essinger | H01M 10/613 429/120 |
| 9,107,293 B2 * | 8/2015 | Fitz-Patrick | B22D 25/02 |

(Continued)

FOREIGN PATENT DOCUMENTS

| | | |
|---|---|---|
| EP | 2 023 473 A2 | 2/2009 |
| EP | 2 315 347 A1 | 4/2011 |

(Continued)

OTHER PUBLICATIONS

International Search Report dated Nov. 21, 2019 in PCT/EP2019/077046 filed Oct. 7, 2019, 2 pages.

*Primary Examiner* — Zachary Pape
(74) *Attorney, Agent, or Firm* — Oblon, McClelland, Maier & Neustadt, L.L.P.

(57) ABSTRACT

An electronic device for a motor vehicle, includes a first housing portion to receive one or more first electronic components, a second housing portion to receive one or more second electronic components, the second housing assembled with the first housing, and a coolant fluid inlet and a coolant fluid outlet, a coolant channel being provided in the electronic device for the coolant fluid flowing from the inlet to the outlet so as to cool all or part of the first electronic components and/or all or part of the second electronic components, said channel having, over most of the course thereof in the device, in particular over the whole (Continued)

of the course thereof in the device, a section perpendicular to the flow direction of the fluid which is: exclusively provided in the first housing portion or exclusively provided in the second housing portion.

8 Claims, 3 Drawing Sheets

(56) References Cited

U.S. PATENT DOCUMENTS

| | | | |
|---|---|---|---|
| 9,894,812 B2 * | 2/2018 | Sakamoto | H01L 23/473 |
| 10,461,657 B2 * | 10/2019 | Nakamura | H05K 7/20927 |
| 2007/0133171 A1 * | 6/2007 | Cheon | H05K 7/20772 |
| | | | 361/699 |
| 2009/0040724 A1 | 2/2009 | Nishikimi et al. | |
| 2009/0231811 A1 | 9/2009 | Tokuyama et al. | |
| 2011/0051371 A1 | 3/2011 | Azuma et al. | |
| 2011/0228479 A1 | 9/2011 | Tokuyama et al. | |
| 2012/0039039 A1 | 2/2012 | Nishikimi et al. | |
| 2012/0170217 A1 | 7/2012 | Nishikimi et al. | |
| 2013/0194853 A1 | 8/2013 | Tokuyama et al. | |
| 2014/0016387 A1 | 1/2014 | Nishikimi et al. | |
| 2015/0055386 A1 | 2/2015 | Nishikimi et al. | |
| 2015/0070955 A1 | 3/2015 | Tokuyama et al. | |
| 2015/0222196 A1 | 8/2015 | Tokuyama et al. | |
| 2015/0349656 A1 | 12/2015 | Tokuyama et al. | |
| 2017/0215304 A1 | 7/2017 | Tokuyama et al. | |

FOREIGN PATENT DOCUMENTS

| | | | | |
|---|---|---|---|---|
| EP | 2557907 A1 * | 2/2013 | | H05K 7/20927 |
| JP | 2010-119300 A | 5/2010 | | |

* cited by examiner

ELECTRONIC EQUIPMENT FOR A VEHICLE

The present invention relates to electronic equipment for a vehicle. This equipment belongs for example to the electrical circuit which permits the electrical supply to a propulsion engine of a hybrid or electric vehicle. This equipment carries out the functions for example of:
- an electrical energy storage unit;
- control of this electrical energy storage unit; and
- a DC/DC converter in order to adapt the voltage level supplied by the electrical energy storage unit to consumers of the vehicle.

Electronic equipment for the electrical supply to a propulsion engine of a vehicle is known from application WO 2017/081255, this equipment comprising a housing in two parts, with part of the interface between these two parts having a form selected such that this interface accommodates part of a coolant channel through which there passes fluid for cooling some or all of the electronic components of the electronic equipment. The creation of this coolant channel at the interface between the two housing parts is complex, since it makes it necessary to provide specific forms on each of these housing parts at the interface.

A channel for coolant fluid is known from application EP 2 023 473, which channel always remains in a frame, i.e. only in a single part of the housing.

There is a need to create in a simple manner a coolant channel within electronic equipment for a vehicle.

The objective of the invention is to fulfil this need, which it does, according to one of its aspects, by means of electronic equipment for a motor vehicle, comprising:
- a first housing part which can receive one or a plurality of first electronic components;
- a second housing part which can receive one or a plurality of second electronic components, the second housing being assembled with the first housing; and
- a coolant fluid inlet and a coolant fluid outlet, a coolant channel being provided in the electronic equipment for the coolant fluid circulating from the fluid inlet to the fluid outlet, such as to cool some or all of the first electronic components and/or some or all of the second electronic components, this channel having along most of its course in the equipment between the coolant fluid inlet and outlet, in particular along all of its course in the equipment, a section perpendicular to the direction of flow of the fluid which is: exclusively provided in the first housing part, or exclusively provided in the second housing part.

In the equipment according to the invention, there is reduction, or even elimination, of the portions of the coolant channel, the section of which that is perpendicular to the direction of flow of the coolant fluid is delimited at the same time by one or more walls of the first housing part, and by one or more walls of the second housing part. In other words, it is thus possible to use first and second housing parts, the surfaces of which that face one another have simpler forms. The production of a first housing part and a second housing part of this type is thus simplified.

Along all of its course in the equipment, the channel can have a section perpendicular to the direction of flow of the fluid which is: exclusively provided in the first housing part, or exclusively provided in the second housing part, if applicable with the exception of the areas of passage from the interior of the first housing part to the interior of the second housing part, and vice versa. In other words, the channel comprises:
- one or more portions, the section of which that is perpendicular to the direction of flow of the fluid is exclusively provided in the first housing part;
- one or more portions, the section of which that is perpendicular to the direction of flow of the fluid is exclusively provided in the second housing part;
- few or no portions, the section of which that is perpendicular to the direction of flow of the fluid is provided in the first housing part and in the second housing part.

Along more than 80%, in particular more than 90%, in particular more than 95%, in particular more than 97% of its course in the equipment between the coolant fluid inlet and outlet, the channel has for example a section perpendicular to the direction of flow of the fluid which is: exclusively provided in the first housing part, or exclusively provided in the second housing part. If applicable, the missing percentages need to reach 100% can correspond to the areas of passage from the aforementioned interior of the first housing part to the interior of the second housing part, and vice versa.

Each of the first housing part and the second housing part can have a base wall and a lateral wall extending around the base wall. The base wall and the lateral wall can be created in a single piece, or not in a single piece. When each housing part is in a single piece, this housing part can be created from metal, for example by casting a metal such as aluminium under pressure.

Each lateral wall can extend between an end for joining with the base wall and a free end, and the first housing part and the second housing part can be assembled via their respective free end. Contrary to the prior art, these free ends which thus form the interface between the first housing part and the second housing part can have simple forms. A single plane can define the free end of all of the lateral wall of the first housing part, and another, parallel plane can define the free end of all of the lateral wall of the second housing part. These parallel planes can be brought against one another during the assembly of the first housing part with the second housing part.

As a variant, whether the free end of the lateral wall of the first housing part and the free end of the lateral wall of the second housing part are flat or not, a seal can be interposed between the first housing part and the second housing part when these housing parts are assembled.

Each of the said planes can be substantially perpendicular to the lateral wall of which it defines the free end. As a variant, the free ends can belong to chamfers with a complementary form, which are or are not flat. In this case, the section of the channel perpendicular to the direction of the flow of coolant fluid at these chamfers can be defined both by the first housing part and by the second housing part.

In the first housing part, the coolant channel can be provided only in the lateral wall and in the base wall. In the second housing part, the coolant channel can be provided exclusively in the lateral wall and in the base wall.

The coolant fluid inlet and outlet can be fitted on the second housing part. This inlet and this outlet can be fitted on a single face of the second housing part, for example being placed side-by-side.

The second housing part can comprise a body on which a plate is added, with the coolant fluid inlet and outlet being fitted on this plate, and this plate defining:
- the portion of the coolant channel which is immediately adjacent to the coolant fluid inlet; and
- the portion of the coolant channel which is immediately adjacent to the coolant fluid outlet.

The plate is for example created by casting metal such as aluminium under pressure.

The portion of the coolant channel which is immediately adjacent to the coolant fluid inlet can define a branch connection between two branches for the fluid entering the coolant channel, and/or the portion of the coolant channel immediately adjacent to the coolant fluid outlet can define a convergence between two branches towards the coolant channel outlet. Downstream from the branch connection, the fluid which leaves the plate can reach the first housing part directly. The fluid can then circulate through the first housing part, before returning to the second housing part.

The second housing part can comprise another plate added onto the body of the second housing part. This other plate is for example created by stamping, being for example made of aluminium. This other plate can define a portion of the coolant channel, in particular the portion of the coolant channel through which the coolant fluid passes, into the second housing part, immediately after the course of the fluid in the first housing part.

This plate and the other plate can belong to opposite faces of the second housing part. In this case, the course of the coolant fluid in this second housing part can take place exclusively in these plates and in the base wall.

The first housing part can be in a single piece or need not be in a single piece.

In all of the foregoing, the base wall of the first housing part and the base wall of the second housing part can have forms which can be superimposed, and these forms can be a rectangle.

In all of the foregoing, the coolant fluid can be a liquid, for example glycolated water.

In a particular example, the channel comprises a plurality of branches, in particular two branches, with each of these branches starting at the aforementioned branch connection and ending at the aforementioned convergence. Each of these branches can have substantially the same form, and a single section of passage can be defined from one branch to the other.

In a particular example, the coolant fluid can circulate along the following course in the equipment:
  course from the fluid inlet in the plate on which the fluid inlet and outlet are fitted, with a branch connection being provided in this plate if applicable;
  course in the first housing part, if applicable in succession via a face of the lateral wall of the first housing part, then via the base wall of the first housing part, then via another face of the lateral wall of the first housing part;
  course in the other plate of the second housing part;
  course in the base wall of the second housing part; then course in the plate as far as the fluid outlet, with a convergence being provided in this plate if applicable.

Each portion of the channel provided in a base wall can project relative to the remainder of this base wall, towards the interior or towards the exterior of the equipment.

The first housing part receives for example cells forming an electrical energy storage unit. The electrical energy storage unit has for example a nominal voltage of 48 V. Fourteen cells or a different number of cells can form this electrical energy storage unit, these cells being in particular fitted in series. These cells of the electrical energy storage unit then form the first electronic components.

The second housing part can receive a static converter. This is for example a DC/DC converter, which makes it possible to convert a first voltage level into a second voltage level.

The first voltage level is for example equal to 12 V, and the second voltage level is equal to 48 V, or this second voltage level is equal to our higher voltage, for example higher than 300 V. In this case, the second electronic components can comprise power modules, capacitors and inductors. In combination with the presence of the static converter, or in the absence of this converter, the second housing part can receive a system for control of the electrical energy storage unit (designated by the initials BMS standing for "battery management system").

In all of the foregoing, the first housing part and the second housing part can form the housing of the equipment, and encapsulate the first electronic component(s), and/or the second electronic component(s). As a variant, some of the first electronic components are placed in the interior of the housing, whereas other first electronic components are supported by the housing, but placed on the exterior of this housing, and/or some of the second electronic components are placed in the interior of the housing, whereas other second electronic components are supported by the housing but placed on the exterior of this housing.

In all of the foregoing, and when the electronic equipment provides the function of a DC/DC converter, an electrical connector with two voltage levels can be present, being for example added onto one of the housing parts, for example the first or the second housing part.

The invention will be able to be better understood by reading the following non-limiting example of implementation thereof, and examining the appended drawing in which.

Figure 1:
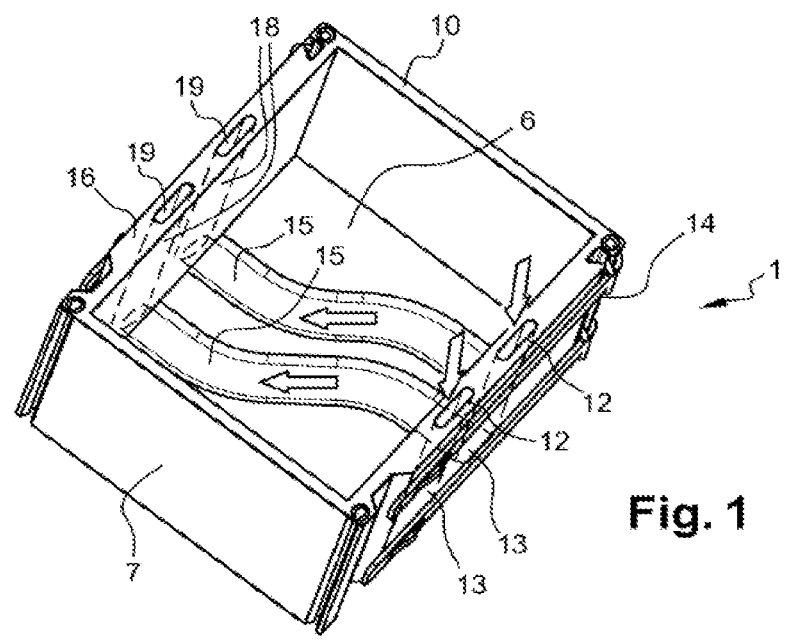
FIG. 1 represents a first part housing part of electronic equipment according to an embodiment of the invention.

FIG. 1 represents an example of a first housing part of electronic equipment according to the invention. In this case, the electronic equipment has a housing formed by the assembly of the first housing part 1 with a second housing part 2, which will be described with reference to FIGS. 2 to 6. If applicable, a seal can be interposed between the first housing part 1 and the second housing part 2 when these housing parts are assembled to one another.

In the example described, this equipment forms part of the electrical circuit which makes it possible to supply electrically the electric propulsion motor of a hybrid or electric vehicle. In the example described, the equipment contains the following functional blocks: electrical energy storage unit, DC/DC converter, and system for control of the electrical energy storage unit (also known as the BMS). As will be seen in FIG. 2, in the example considered, the equipment comprises an electrical connector 3 comprising contacts permitting connection to an electrical network of a first voltage level, and other contacts permitting connection to an electrical network of a second voltage level.

In the example considered, the first voltage level is for example 12 V, and the network having this voltage level can comprise an electrical energy storage unit at this voltage, and form the conventional on-board network of the vehicle. Again in the example considered, the second voltage level is 48 V, and the network having this voltage level permits the electrical supply to the electric propulsion motor of the vehicle. Other voltage values are however possible for the first voltage level and/or the second voltage level. The second voltage level can for example as a variant have a value higher than 300 V.

In the example considered, the first housing part 1 receive cells forming the electrical energy storage unit. Fourteen cells are for example connected in series such as to supply a nominal voltage of 48 V. The cells, corresponding to first electronic components placed in the first housing part 1 are not represented in FIG. 1.

FIG. 1 shows that the first housing part 1 comprises a base wall 6 with a substantially rectangular form, and a lateral wall 7. In the example considered, the base wall 6 is created by casting under pressure, whereas the lateral wall 7 is created by extrusion. In a variant, these walls 6 and 7 can be created in a single piece.

In the example considered, the lateral wall 7 extends all around the base wall 6, between an end for joining with the base wall 6 and a free end 10. FIG. 1 shows that the free end 10 can belong to the same plane in its entirety, and in this case this plane is substantially parallel to the base wall 6.

As will be seen hereinafter, a coolant channel is provided in the first housing part 1, in this first housing part 1 being in the form of two branches placed side-by-side. In this case, each branch comprises a portion 13 provided in a face 14 of the lateral wall 7, between a respective orifice 12 provided in this free end 10 and the base wall 6. Each portion 13 is extended by a portion 15 provided in the base wall 6, each portion 15 being able to project, or not project, towards the interior of the equipment, relative to the remainder of this base wall 6. In the example considered, the two portions 15 each have an undulating form in the base wall 6, between the face 14 of the lateral wall 7 and another face 16 of this lateral wall, opposite the face 14. Each portion 15 of a branch is extended in the face 16 of the lateral wall 7 by a portion 18 provided within this face 16, and each portion 18 extends in a substantially straight manner between the base wall 6 and a respective orifice 19 provided in the free end 10.

With reference to FIGS. 2 to 6, a description will now be provided of a second housing part 2 according to the embodiment considered.

As can be seen in the figures, similarly to the first housing part 1, the second housing part 2 comprises a base wall 20 and a lateral wall 21 extending all around the base wall 20. The base wall 20 also has a substantially rectangular form.

The lateral wall 21 extends between an end for joining with the base wall 20 and a free end 22. In this case, this free end 22 extends entirely on one plane, and, in the example considered, this plan is parallel to the plane on which the free end 10 of the first housing part 1 extends.

In this case, the second housing part 2 is formed by a body which in the example considered defines the base wall 20 and a part of the lateral wall 21. In this case, this body is created by casting of aluminium under pressure. The electrical connector 3 previously mentioned is added onto this body. In this case, this electrical connector 3 is fitted on the base wall 20, on the exterior thereof.

Figure 2:
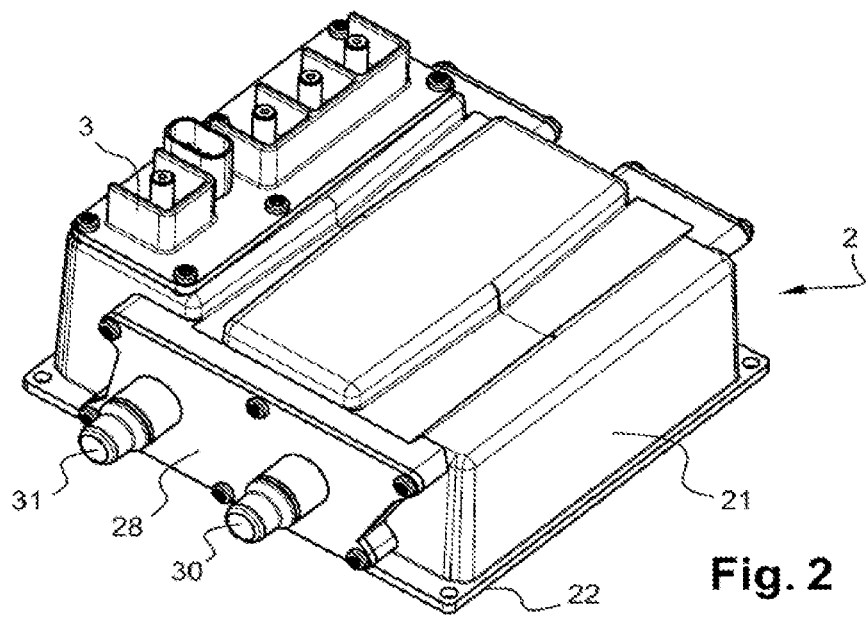
FIG. 2 represents a second housing part which is designed to be assembled with the first housing part in FIG. 1.
Figure 3:
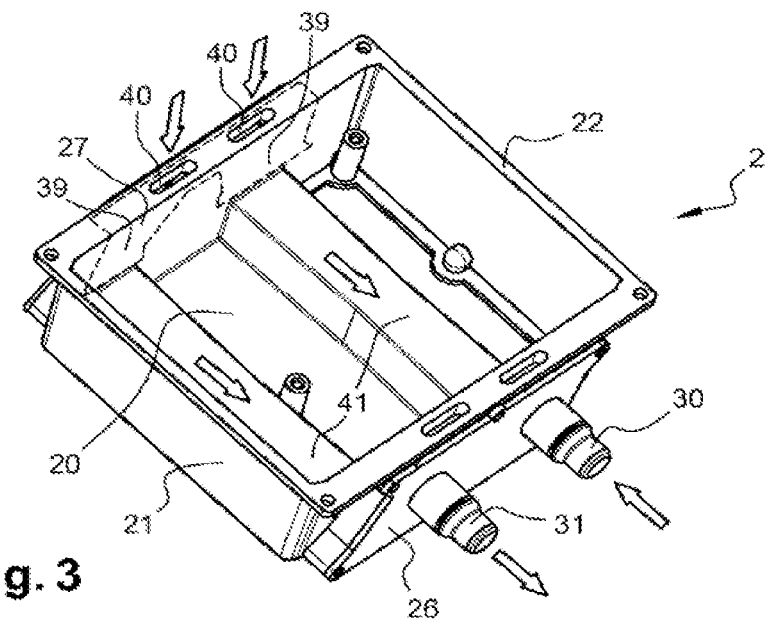
FIGS. 3 and 4 are two views from above of the second housing part, with the second electronic components having been omitted from these figures.
Figure 4:
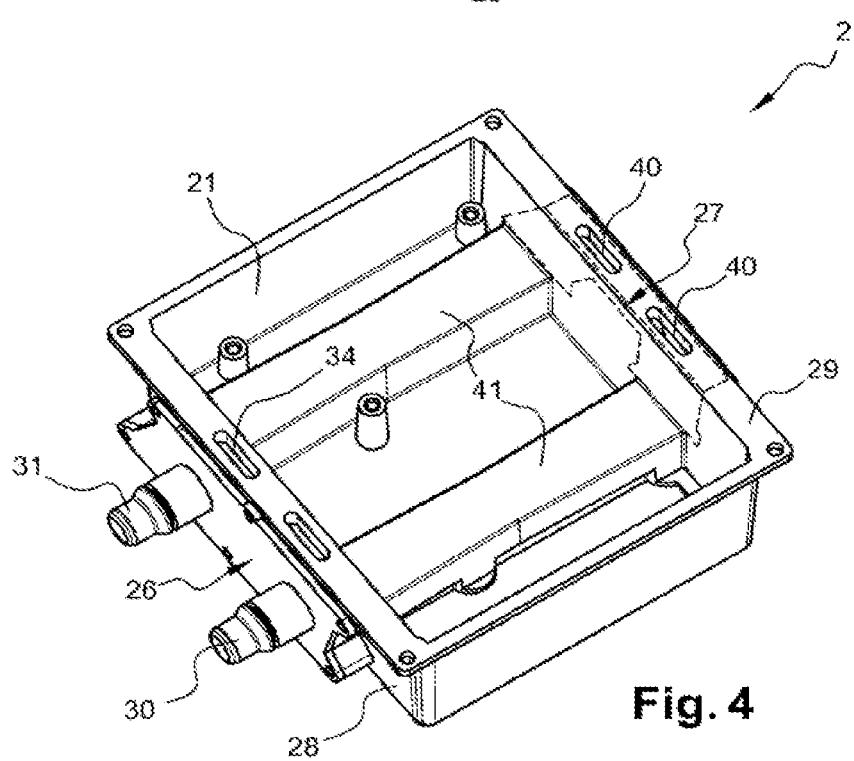

FIGS. 3 and 4 also show that two plates 26 and 27 are added onto the body, respectively on two faces 28 and 29 of the lateral wall 21. The plate 26 is for example created by casting of aluminium under pressure, whereas the plate 27 is created by stamping of aluminium. FIGS. 2 to 4 also show that a coolant fluid inlet 30, as well as a coolant fluid outlet 31, are secured on the plate 26. This inlet 30 and this outlet 31 are in this case formed by straight joining pieces which are placed side-by-side. As a variant, the joining pieces used could be curved.

Figure 5:
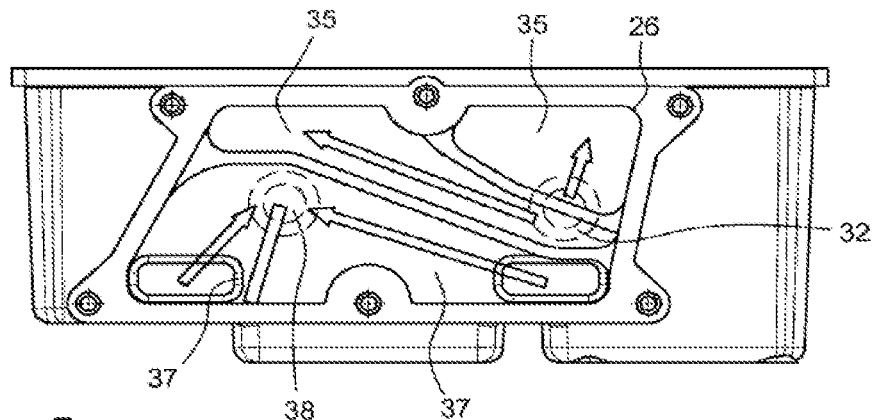
FIG. 5 is a side view of the second housing part in FIGS. 3 and 4.

As can be seen in FIG. 5, the coolant fluid inlet 30 opens into the plate 26 via an orifice 32, and, for the fluid penetrating via this orifice 32, the plate 26 defines a branch connection by means of which the coolant channel is separated into two branches. Each of these branches is then defined by a portion 35 extending in the plate 26 of the branch connection as far as a respective orifice 34 provided in the free end 22 of the lateral wall 21 of the second housing part 2.

FIG. 5 also shows that the plate 26 additionally defines a convergence for the two branches of the coolant channel. Each branch comprises an end portion 37 in the plate 26, and this end portion 37 extends into the plate 26 as far as the convergence. The plate 26 also comprises an orifice 38 which is connected to the coolant fluid outlet 31, thus allowing the coolant fluid to leave the plate 26 towards the outlet 31.

FIGS. 3 and 4 show that, for each branch of the coolant channel, the plate 27 defines a portion 39, with each portion 39 extending between a respective orifice 40 by means of which the coolant fluid reaches the second housing part 2 from the first housing part 1, and the base wall 20. It is found in this case that, from one branch to the other, the portions 39 have the same straight form, but diverge relative to one another.

Each portion 39 is extended by a portion 41 which is provided in the base wall 20, and is straight. In this case, the two portions 41 are parallel. Each portion 41 extends as far as the plate 26, where it is extended by an end portion 37. In the example considered, each portion 41 projects towards the interior of the equipment relative to the remainder of the base wall 20.

The course of the coolant fluid, which is for example glycolated water, in the equipment, will be described with reference to FIGS. 1, 3 and 5, in which arrows are represented.

The coolant fluid which reaches the equipment via the coolant fluid inlet 30 goes into the plate 26 via the orifice 32. The coolant fluid is then distributed between two branches via the portions 35, and leaves the second housing part via a respective orifice 34 provided in the free end 22 of the peripheral wall 21 of this second housing part 2. This coolant fluid then reaches the first housing part via a respective orifice 12 provided in the free end 10 of the peripheral wall 7, and then circulates in succession in the portions 13, 15 and 18 previously described as far as a respective orifice 19 provided in the free end 10 of the lateral wall 7 of the first housing part 1. The coolant fluid leaves this first housing part 1 via this orifice 19, and then returns into the second housing part 2 via an orifice 40 into the plate 27, then goes in succession into the portions 39, 41 and 37 described above. The two branches join in the plate 26 at the convergence, then the coolant fluid leaves the second housing part 2 via the orifice 38 by means of which it reaches the coolant fluid outlet 31.

In the example considered, at all points of the coolant channel, its section perpendicular to the direction of the flow is exclusively provided in the first housing part 1 or exclusively provided in the second housing part 2. Depending on whether the free end 11 of the lateral wall 7 of the first housing part 1 and the free end 22 of the lateral wall 21 of the second housing part 2 do or do not belong respectively to planes which are parallel to one another and are perpendicular to their respective lateral wall, sections of the coolant channel which are perpendicular to the direction of flow, which would be provided both in the first housing part 1 and in the second housing part 2, can exist at the interface between these two housing parts.

In FIGS. 2 to 5, the second electronic components which are received in the second housing part 2, and which, in the example described, make it possible to ensure the functions of a DC/DC converter and control of the cells of the electrical energy storage unit, are not represented.

Figure 6:
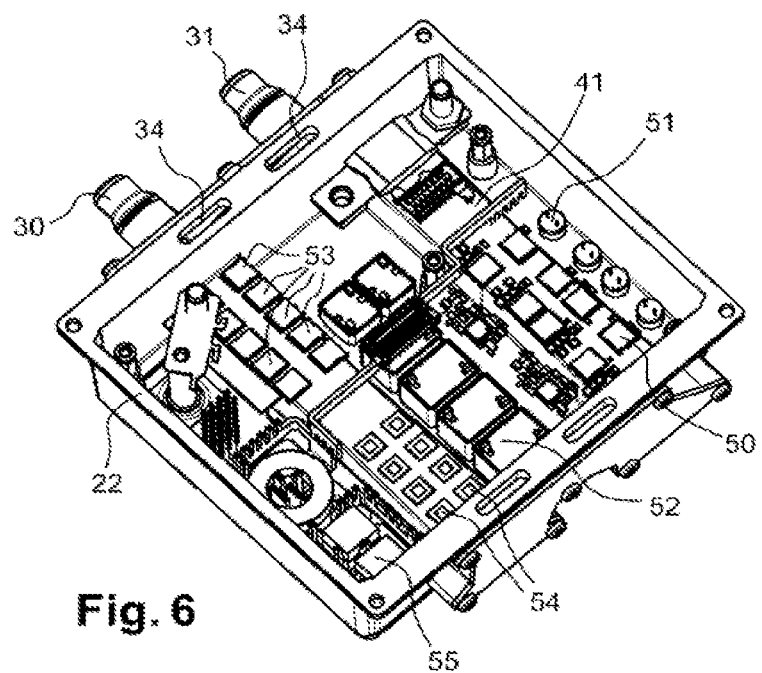
FIG. 6 is a view similar to FIGS. 3 and 4 of the second housing part, in which the second electronic components are represented.

These components are shown in FIG. 6. It is thus found that, in this case, the following are placed on the base wall 21 of the second housing part 2:
- power modules 50, capacitors 51, and inductors 52 forming the DC/DC converter;
- units 53 forming the system for control of the cells of the electrical energy storage unit of the first housing part 1;
- controllable electronic switches 54, for example MOS transistors, provided in the event of faults (for safety);
- an electromagnetic interference filter 55 for the 12 V voltage level.

The invention is not limited to the example which has just been described.

In particular, although the invention has been described with first and second electronic components which are placed in the interior of each housing part 1, 2, such that these components are encapsulated by the housing formed by the assembly of the housing parts 1 and 2, the invention can be different. Some or all of the first electronic components, and/or some or all of the second electronic components can for example be supported by a base wall of the corresponding housing part, whilst being placed on the exterior of this base wall.

The invention claimed is:

1. Electronic equipment for a motor vehicle, comprising:
a first housing part which can receive one or a plurality of first electronic components;
a second housing part which can receive one or a plurality of second electronic components, the second housing part being assembled with the first housing part; and
a coolant fluid inlet and a coolant fluid outlet, a coolant channel being provided in the first housing part and in the second housing part for the coolant fluid circulating from the fluid inlet to the outlet, such as to cool some or all of the first electronic components and/or some or all of the second electronic components,
wherein in the equipment between the coolant fluid inlet and outlet, a path of the channel includes a section perpendicular to a direction of flow of the fluid along the path, the section is exclusively provided in the first housing part, or exclusively provided in the second housing part,
wherein each of the first housing part and the second housing part includes a base wall and lateral walls extending around the base wall, and
wherein each lateral wall extends between an end for joining with the base wall and a free end, and the first housing part and the second housing part are assembled via their free end,
wherein the first housing part receives cells forming an electrical energy storage unit, and
wherein the second housing part receives a static converter.

2. The equipment according to claim 1, in the first housing part the coolant channel being provided only in the lateral wall and in the base wall, and/or in the second housing part the coolant channel being provided only in the lateral wall and in the base wall.

3. The equipment according to claim 1, the coolant fluid inlet and outlet being fitted on the second housing part.

4. The equipment according to claim 3, the second housing part comprising a body on which a plate is added, with the coolant fluid inlet and outlet being fitted on this plate, and this plate defining the portion of the coolant channel which is immediately adjacent to the coolant fluid inlet and the portion of the coolant channel which is immediately adjacent to the coolant fluid outlet.

5. The equipment according to claim 4, with the portion of the coolant channel which is immediately adjacent to the coolant fluid inlet defining a branch connection between two branches for the fluid entering the coolant channel, and/or with the portion of the coolant channel which is immediately adjacent to the coolant fluid outlet defining a convergence between two branches towards the coolant channel outlet.

6. The equipment according to claim 4, with the second housing part comprising another plate added onto the body, this other plate defining a portion of the coolant channel, in particular the portion of the coolant channel through which the coolant fluid passes, into the second housing part, immediately after its course in the first housing part.

7. The equipment according to claim 1,
wherein the static converter is a DC/DC converter; and
wherein the second housing part includes a system for controlling the electrical energy storage unit.

8. The equipment according to claim 1, with the first housing part and the second housing part forming the housing of the equipment, and encapsulating the first electronic components, and the second electronic components.

\* \* \* \* \*